(12) United States Patent
Campbell et al.

(10) Patent No.: US 9,414,525 B2
(45) Date of Patent: Aug. 9, 2016

(54) COOLANT-COOLED HEAT SINK CONFIGURED FOR ACCELERATING COOLANT FLOW

(71) Applicant: INTERNATIONAL BUSINESS MACHINES CORPORATION, Armonk, NY (US)

(72) Inventors: Levi A. Campbell, Poughkeepsie, NY (US); Richard C. Chu, Hopewell Junction, NY (US); Milnes P. David, Fishkill, NY (US); Michael J. Ellsworth, Jr., Poughkeepsie, NY (US); Madhusudan K. Iyengar, Foster City, CA (US); Roger R. Schmidt, Poughkeepsie, NY (US); Robert E. Simons, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/827,588

(22) Filed: Aug. 17, 2015

(65) Prior Publication Data
US 2015/0359137 A1    Dec. 10, 2015

Related U.S. Application Data

(63) Continuation of application No. 14/058,562, filed on Oct. 21, 2013.

(51) Int. Cl.
*H01L 23/473* (2006.01)
*H05K 7/20* (2006.01)

(52) U.S. Cl.
CPC .......... *H05K 7/2039* (2013.01); *H05K 7/20254* (2013.01); *H05K 7/20772* (2013.01)

(58) Field of Classification Search
CPC ......... F28F 13/06; F28F 13/08; H05K 7/2039
See application file for complete search history.

(56) References Cited

U.S. PATENT DOCUMENTS

| 4,103,737 A | 8/1978 | Perkins et al. |
| 4,765,397 A | 8/1988 | Chrysler et al. |

(Continued)

FOREIGN PATENT DOCUMENTS

| DE | 102005034773 A1 | * | 2/2007 | .............. F28F 13/08 |
| WO | WO 2012056585 A1 | * | 5/2012 | .............. F28F 13/06 |

OTHER PUBLICATIONS

Remsburg et al., "Nonlinear Fin Patterns Keep Cold Plates Cooler", Power Electronics Technology, Feb. 2007 (4 pages).

(Continued)

*Primary Examiner* — Frantz Jules
*Assistant Examiner* — Nelson Nieves
(74) *Attorney, Agent, or Firm* — Steven Chiu, Esq.; Kevin P. Radigan, Esq.; Heslin Rothenberg Farley & Mesiti P.C.

(57) ABSTRACT

Cooling apparatuses, cooled electronic modules, and methods of fabrication are provided which facilitate heat transfer from one or more electronic components to a coolant. The cooling apparatus includes a coolant-cooled heat sink with a thermally conductive structure having a coolant-carrying compartment including a varying cross-sectional coolant flow area through which coolant flows in a direction substantially parallel to a main heat transfer surface of the structure coupled to the electronic component(s). The coolant-cooled heat sink includes a coolant inlet and a coolant outlet in fluid communication with the coolant-carrying compartment, and the coolant flow area of the coolant-carrying compartment decreases, at least in part, in a direction of coolant flow through the coolant-carrying compartment. The decreasing coolant flow area facilitates an increasing effective heat transfer coefficient between the main heat transfer surface and the coolant by, at least in part, accelerating the coolant flow within the coolant-carrying compartment.

4 Claims, 8 Drawing Sheets

(56) References Cited

U.S. PATENT DOCUMENTS

| | | |
|---|---|---|
| 4,953,634 A | 9/1990 | Nelson et al. |
| 5,072,787 A | 12/1991 | Nakamichi |
| 6,508,301 B2 | 1/2003 | Marsala |
| 6,819,561 B2 | 11/2004 | Hartzell et al. |
| 7,178,586 B2 | 2/2007 | Goldman et al. |
| 7,240,722 B2 | 7/2007 | Lai et al. |
| 7,400,505 B2 | 7/2008 | Campbell et al. |
| 7,509,995 B2 | 3/2009 | Bhatti et al. |
| 7,916,483 B2 | 3/2011 | Campbell et al. |
| 2007/0227699 A1 | 10/2007 | Nishi |
| 2009/0145581 A1 | 6/2009 | Hoffman et al. |
| 2009/0294113 A1* | 12/2009 | Cha .................. F28F 13/06 165/185 |
| 2010/0172091 A1 | 7/2010 | Nishiura |
| 2011/0048687 A1 | 3/2011 | Des Champs |
| 2011/0299265 A1* | 12/2011 | Nakatsu .......... H05K 7/20927 361/820 |
| 2012/0014063 A1 | 1/2012 | Weiss |
| 2013/0055722 A1* | 3/2013 | Verhiel ............. F23R 3/007 60/772 |
| 2013/0240195 A1 | 9/2013 | Chen et al. |
| 2014/0262186 A1* | 9/2014 | Kandlikar ............ F28F 13/08 165/177 |
| 2015/0107801 A1 | 4/2015 | Campbell et al. |
| 2015/0181756 A1* | 6/2015 | Sato .................. H05K 7/20936 165/64 |

OTHER PUBLICATIONS

Kandlikar et al., "Liquid Cooled Cold Plate for Industrial High-Power Electronic Devices—Thermal Design and Manufacturing Considerations", Heat Transfer Engineering, vol. 30, No. 12, pp. 918-930 (2009).

Campbell et al., Office Action for U.S. Appl. No. 14/058,562, filed Oct. 21, 2013 (U.S. Patent Publication No. 2015/0107801 A1), dated Aug. 11, 2015 (17 pages).

Campbell et al., Final Office Action for U.S. Appl. No. 14/058,562, filed Oct. 21, 2013 (U.S. Patent Publication No. 2015/0107801 A1), dated Jan. 21, 2016 (10 pages).

Campbell et al., Notice of Allowance for U.S Appl. No. 14/058,562, filed Oct. 21, 2013 (US. Patent Publication No. 2015/0107801 A1), dated May 26, 2016 (8 pages).

* cited by examiner

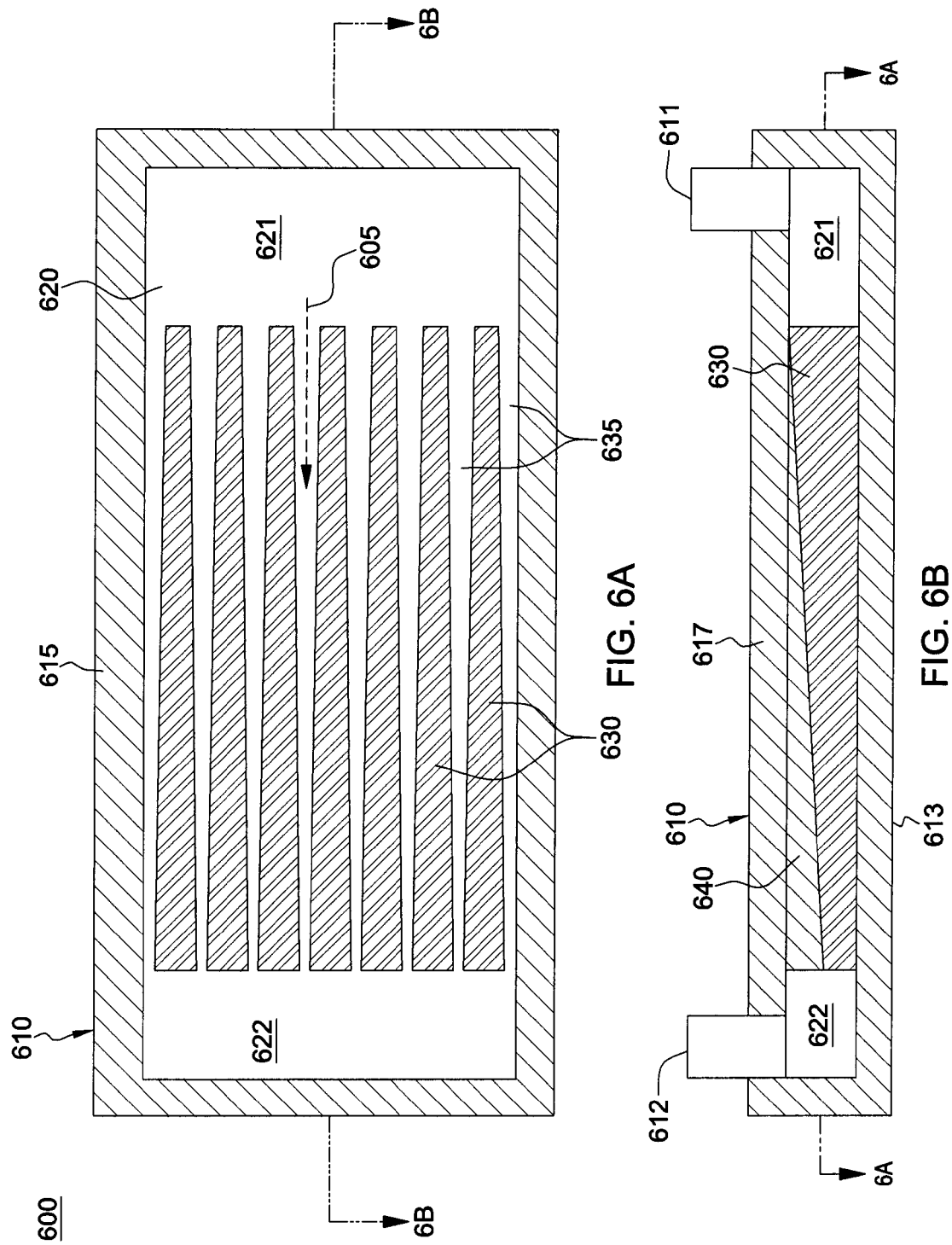

COOLANT-COOLED HEAT SINK CONFIGURED FOR ACCELERATING COOLANT FLOW

BACKGROUND

As is known, operating electronic components produce heat. This heat should be removed in an effective manner to maintain device junction temperatures within desirable limits, with failure to do so resulting in excessive component temperatures, potentially leading to thermal runaway conditions. Several trends in the electronics industry have combined to increase the importance of thermal management, including heat removal for electronic components, including technologies where thermal management has traditionally been less of a concern, such as CMOS. In particular, the need for faster and more densely packed circuits has had a direct impact on the importance of thermal management. First, power dissipation, and therefore heat production, increases as device operating frequencies increase. Second, increased operating frequencies may be possible at lower device junction temperatures. Further, as more and more devices or components are packed onto a single chip, heat flux (Watts/cm$^2$) increases, resulting in the need to dissipate more power from a given size chip or module. These trends have combined to create applications where it is no longer desirable to remove heat from modern devices solely by traditional air cooling methods, such as by using air cooled heat sinks with heat pipes or vapor chambers. Such air cooling techniques are inherently limited in their ability to extract heat from an electronic component with high power density.

The need to cool current and future high heat load, high heat flux electronic devices therefore mandates the development of aggressive thermal management techniques using, for instance, liquid cooling.

BRIEF SUMMARY

Provided herein in one or more aspects is a method which includes: providing a coolant-cooled heat sink configured to facilitate cooling at least one electronic component. The providing the coolant-cooled heat sink comprises: providing a thermally conductive structure with a coolant-carrying compartment comprising, at least in part, a varying cross-sectional coolant flow area through which coolant flows in a direction substantially parallel to a main heat transfer surface of the thermally conductive structure to couple to the at least one electronic component; providing a coolant inlet and a coolant outlet associated with the thermally conductive structure and in fluid communication with the coolant-carrying compartment of the thermally conductive structure to facilitate coolant flow therethrough; and wherein the cross-sectional coolant flow area of the coolant-carrying compartment decreases, at least in part, between the coolant inlet and the coolant outlet in a direction of coolant flow through the coolant-carrying compartment, the decreasing coolant flow area facilitating providing an increasing effective heat transfer coefficient between the main heat transfer surface and the coolant within the coolant-carrying compartment in a direction of coolant flow by, at least in part, accelerating the coolant flow within the coolant-carrying compartment of the coolant-cooled heat sink.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 6A is a cross-sectional plan view of another embodiment of a coolant-cooled heat sink, in accordance with one or more aspects of the present invention; and FIG. 6B is a cross-sectional elevational view of the coolant-cooled heat sink of FIG. 6A, in accordance with one or more aspects of the present invention.

DETAILED DESCRIPTION

Figure 1:
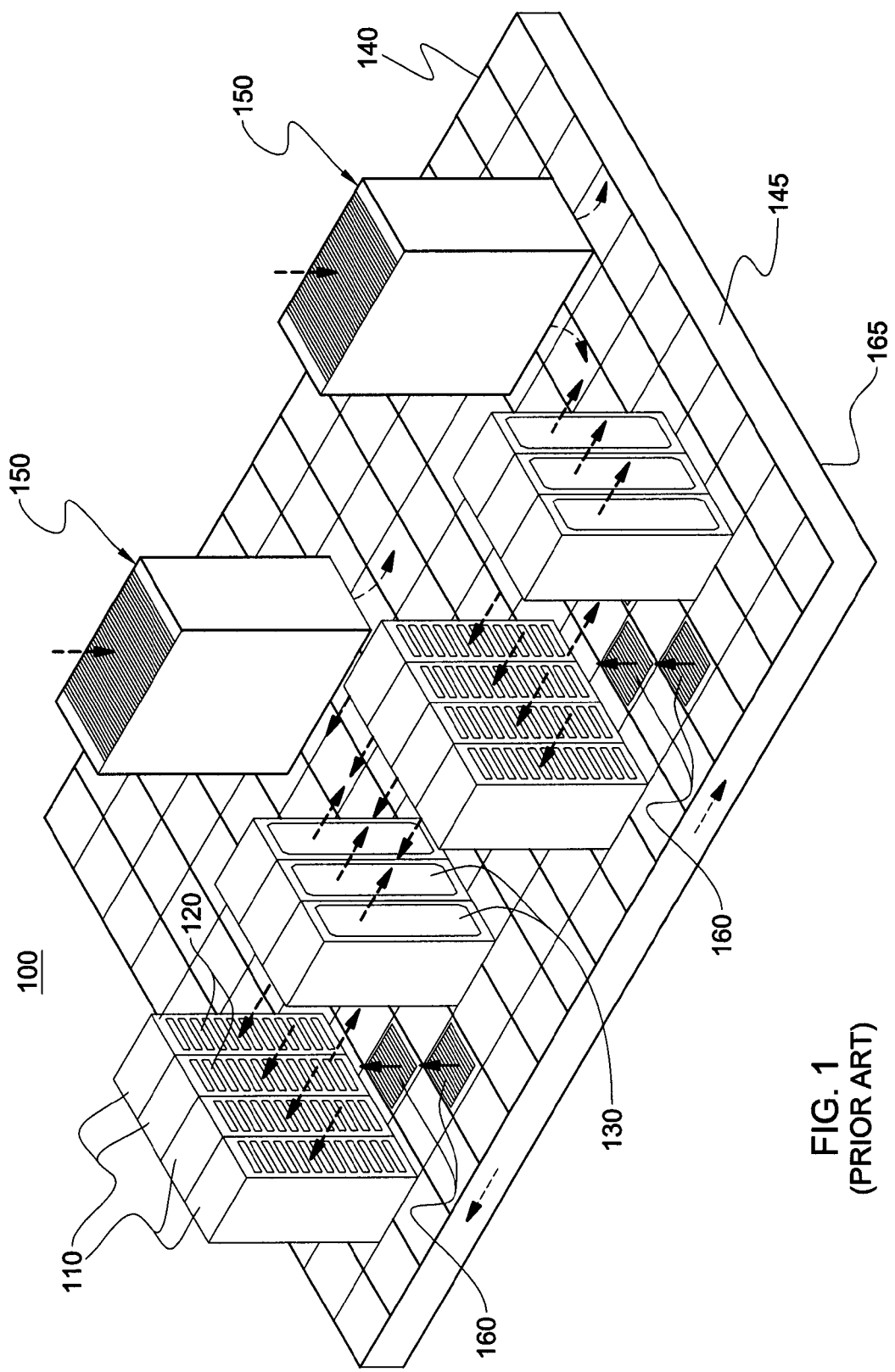
FIG. 1. depicts one embodiment of a conventional raised floor layout of an air-cooled data center.

As used herein, the terms "electronics rack" and "rack unit" are used interchangeably, and unless otherwise specified include any housing, frame, rack, compartment, blade server system, etc., having one or more heat-generating components of a computer system, electronic system, or information technology equipment, and may be, for example, a stand-alone computer processor having high, mid or low end processing capability. In one embodiment, an electronics rack may comprise a portion of an electronic system, a single electronic system, or multiple electronic systems, for example, in one or more sub-housings, blades, books, drawers, nodes, compartments, etc., having one or more heat-generating electronic components disposed therein. An electronic system within an electronics rack may be movable or fixed relative to the electronics rack, with the rack-mounted electronic drawers and blades of a blade center system being two examples of systems of an electronics rack to be cooled.

"Electronic component" refers to any heat-generating electronic component of, for example, a computer system or other electronics unit requiring cooling. By way of example, an electronic component may comprise one or more integrated circuit die (or chips) and/or other electronic devices to be cooled, including one or more processor chips, memory chips and/or memory support chips. Further, the term "cold plate" refers to any thermally conductive structure having one or more compartments, channels, passageways, etc., formed therein for the flowing of coolant therethrough. In addition, "metallurgically bonded" refers generally herein to two components being welded, brazed or soldered together by any means.

As used herein, a "liquid-to-liquid heat exchanger" may comprise, for example, two or more coolant flow paths, formed of thermally conductive tubing (such as copper or other tubing) in thermal or mechanical contact with each other. Size, configuration and construction of the liquid-to-liquid heat exchanger can vary without departing from the scope of the invention disclosed herein. Further, "data center" refers to a computer installation containing one or more electronics racks to be cooled. As a specific example, a data center may include one or more rows of rack-mounted computing units, such as server units.

One example of the coolants discussed herein, such as the facility coolant or system coolant, is water. However, the cooling concepts disclosed herein are readily adapted to use with other types of coolant on the facility side and/or on the system side. For example, one or more of the coolants may comprise a brine, a fluorocarbon liquid, a hydrofluoroether liquid, a liquid metal, or other similar coolant, or refrigerant, while still maintaining the advantages and unique features of the present invention.

Reference is made below to the drawings, which are not drawn to scale to facilitate an understanding thereof, wherein the same reference numbers used throughout different figures designate the same or similar components.

FIG. 1 depicts one embodiment of a raised floor layout of an air cooled data center 100 typical in the prior art, wherein multiple electronics racks 110 are disposed in one or more rows. A data center such as depicted in FIG. 1 may house several hundred, or even several thousand microprocessors. In the arrangement illustrated, chilled air enters the computer room via perforated floor tiles 160 from a supply air plenum 145 defined between the raised floor 140 and a base or subfloor 165 of the room. Cooled air is taken in through louvered covers at air inlet sides 120 of the electronics racks and expelled through the back (i.e., air outlet sides 130) of the electronics racks. Each electronics rack 110 may have one or more air moving devices (e.g., fans or blowers) to provide forced inlet-to-outlet airflow to cool the electronic devices within the system(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more air conditioning units 150, also disposed within the data center 100. Room air is taken into each air conditioning unit 150 near an upper portion thereof. This room air may comprise in part exhausted air from the "hot" aisles of the computer installation defined, for example, by opposing air outlet sides 130 of the electronics racks 110.

Figure 2:
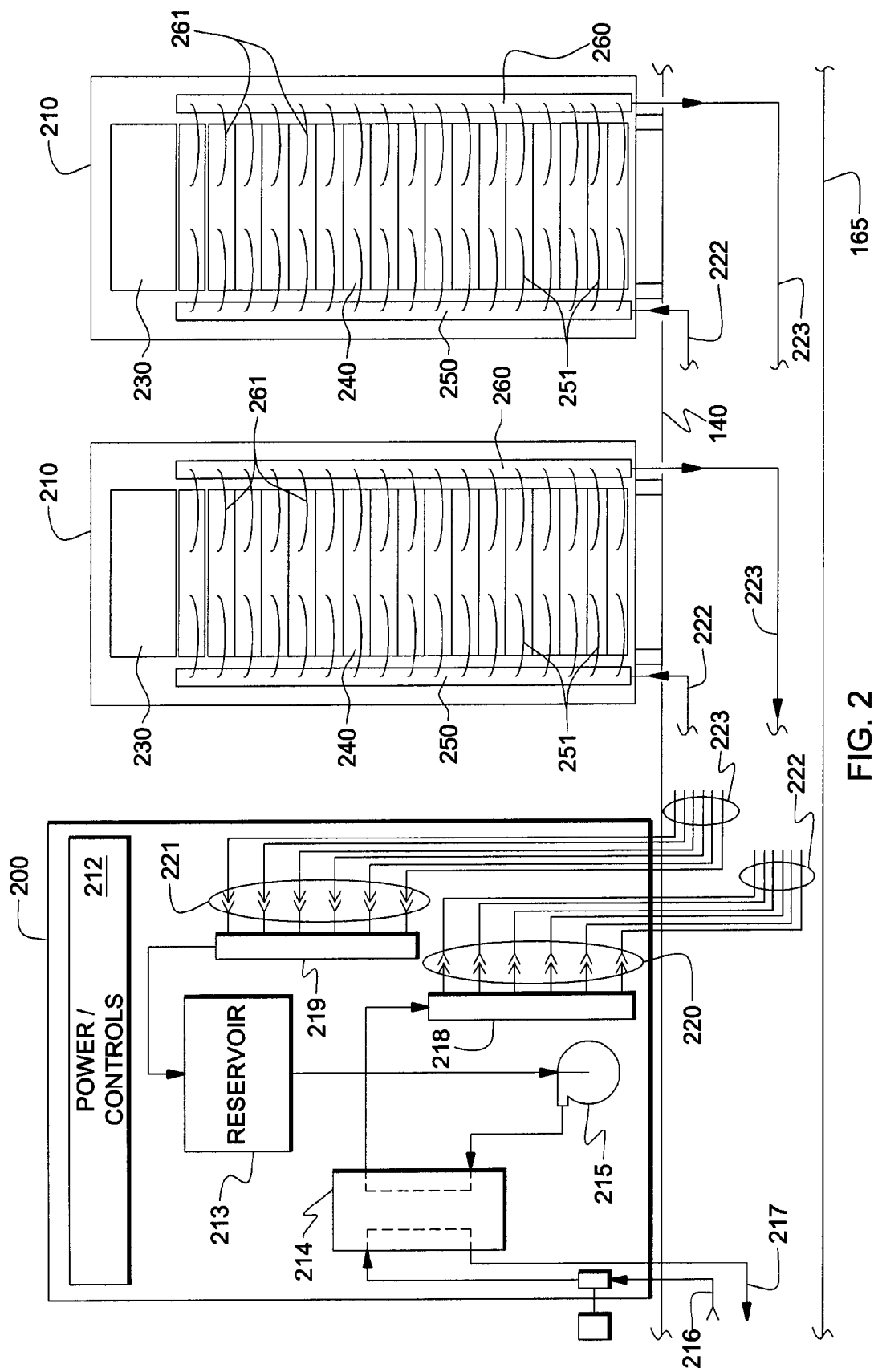
FIG. 2 depicts one embodiment of a coolant distribution unit facilitating liquid-cooling of electronics racks of a data center, in accordance with one or more aspects of the present invention.
Figure 3:
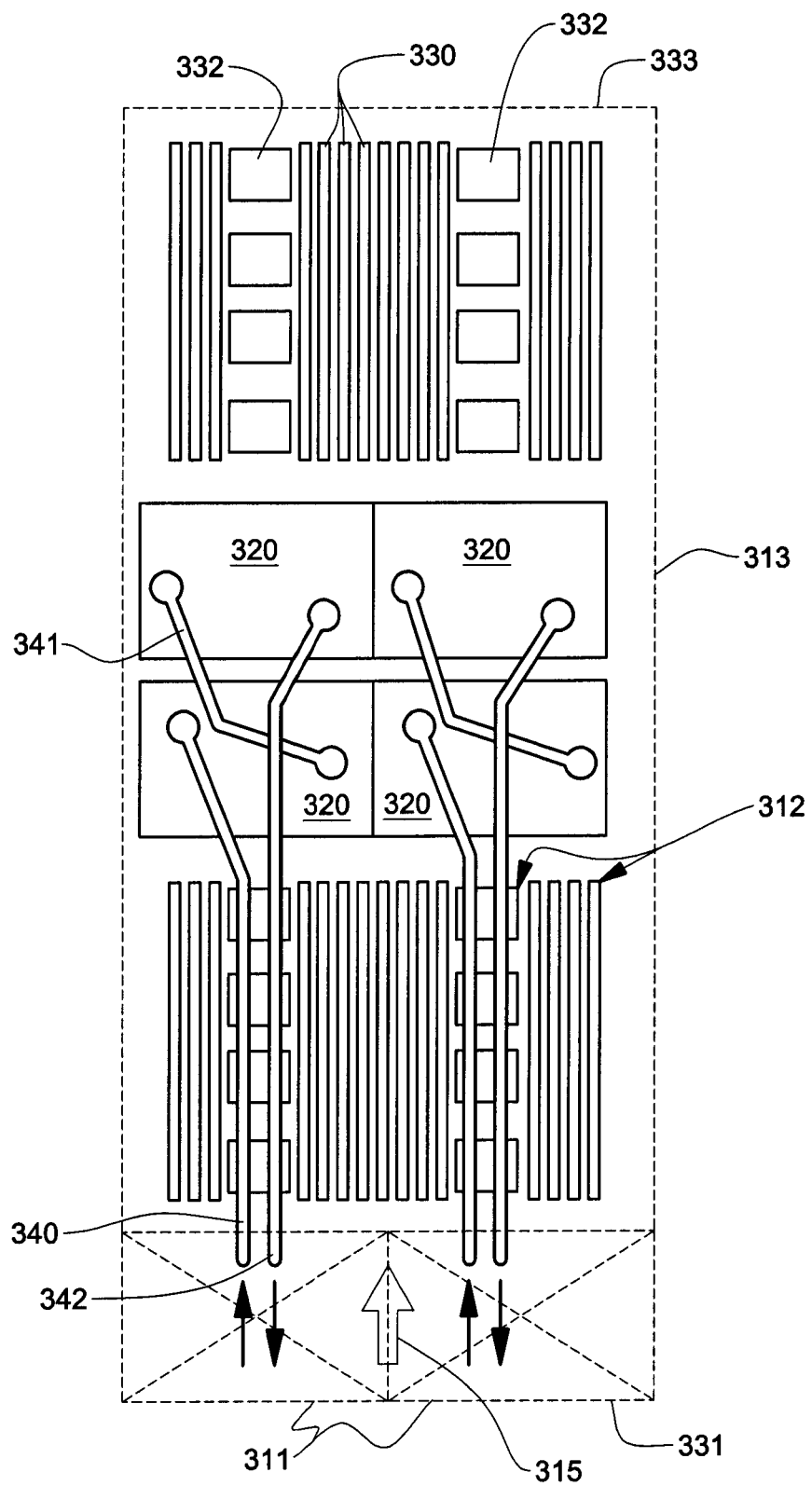
FIG. 3 is a plan view of one embodiment of an electronic system (or node) layout illustrating an air and liquid cooling apparatus for cooling components of the electronic system, in accordance with one or more aspects of the present invention.
Figure 4:
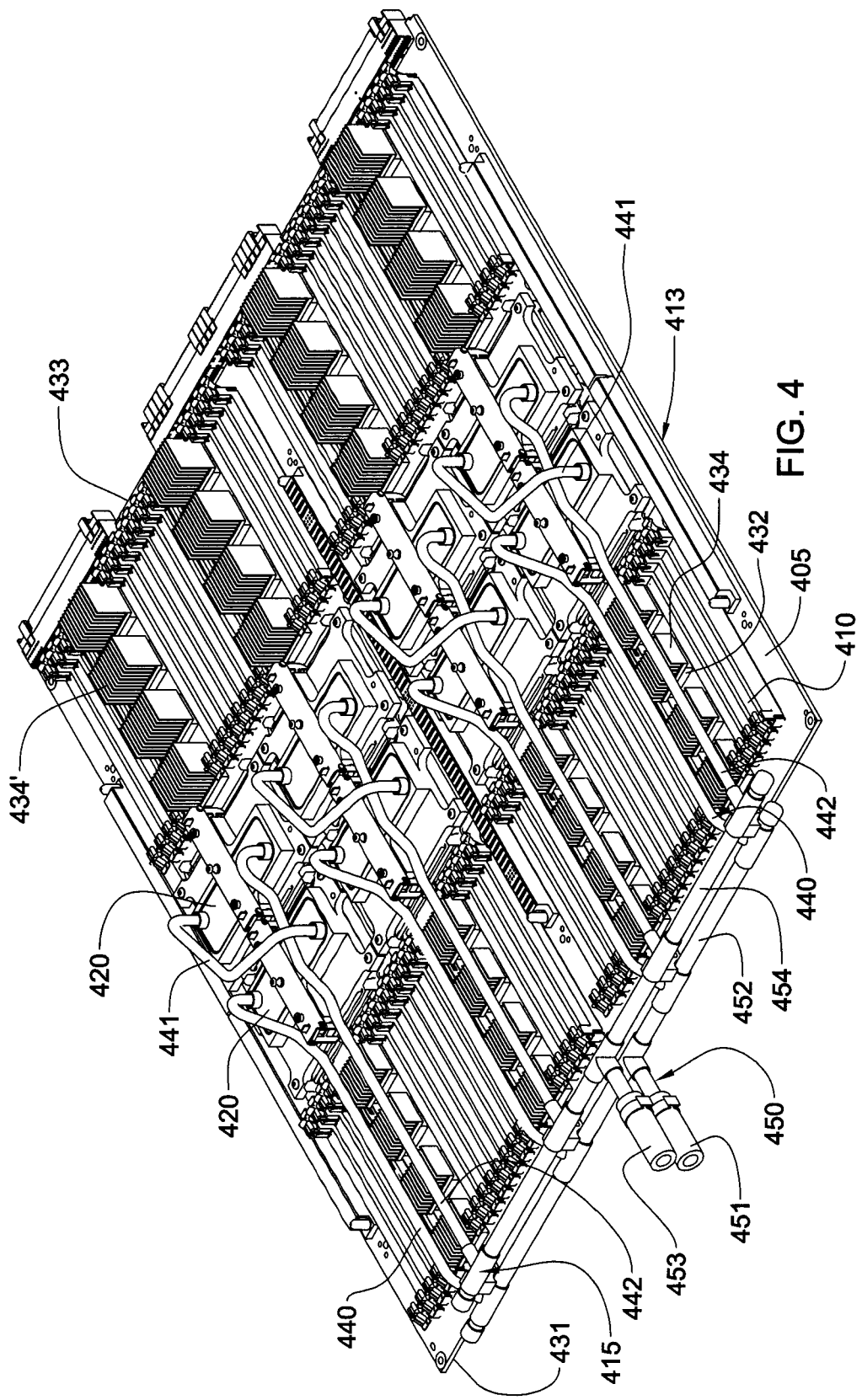
FIG. 4 depicts one detailed embodiment of a partially assembled electronic system layout, wherein the electronic system includes eight heat-generating electronic components to be cooled, each having, in one embodiment, a respective cooling apparatus associated therewith, in accordance with one or more aspects of the present invention.

Due to the ever-increasing airflow requirements through electronics racks, and the limits of air distribution within the typical data center installation, liquid-based cooling may, for instance, be combined with the above-described conventional air-cooling. FIGS. 2-4 illustrate one embodiment of a data center implementation employing a liquid-based cooling system with one or more cold plates coupled to high heat-generating electronic components disposed within an electronics rack.

In particular, FIG. 2 depicts one embodiment of a coolant distribution unit 200 for a data center. The coolant distribution unit is conventionally a relatively large unit which occupies what would be considered a full electronics frame. Within coolant distribution unit 200 is a power/control element 212, a reservoir/expansion tank 213, a heat exchanger 214, a pump 215 (often accompanied by a redundant second pump), facility water inlet 216 and outlet 217 supply pipes, a supply manifold 218 supplying water or system coolant to the electronics racks 210 via couplings 220 and lines 222, and a return manifold 219 receiving water from the electronics racks 210, via lines 223 and couplings 221. Each electronics rack includes (in one example) a power/control unit 230 for the electronics rack, multiple electronic systems 240, a system coolant supply manifold 250, and a system coolant return manifold 260. As shown, each electronics rack 210 is disposed on raised floor 140 of the data center with lines 222 providing system coolant to system coolant supply manifolds 250 and lines 223 facilitating return of system coolant from system coolant return manifolds 260 being disposed in the supply air plenum beneath the raised floor.

In the embodiment illustrated, the system coolant supply manifold 250 provides system coolant to the cooling systems of the electronic systems (more particularly, to liquid-cooled cold plates thereof) via flexible hose connections 251, which are disposed between the supply manifold and the respective electronic systems within the rack. Similarly, system coolant return manifold 260 is coupled to the electronic systems via flexible hose connections 261. Quick connect couplings may be employed at the interface between flexible hoses 251, 261 and the individual electronic systems. By way of example, these quick connect couplings may comprise various types of commercially available couplings, such as those available from Colder Products Company, of St. Paul, Minn., USA, or Parker Hannifin, of Cleveland, Ohio, USA.

Although not shown, electronics rack 210 may also include an air-to-liquid heat exchanger disposed at an air outlet side thereof, which also receives system coolant from the system coolant supply manifold 250 and returns system coolant to the system coolant return manifold 260.

FIG. 3 depicts one embodiment of an electronic system 313 component layout wherein one or more air moving devices 311 provide forced air flow 315 to cool multiple components 312 within electronic system 313. Cool air is taken in through a front 331 and exhausted out a back 333 of the system. The multiple components to be cooled include multiple processor modules to which liquid-cooled cold plates 320 (of a liquid-based cooling system) are coupled, as well as multiple arrays of memory modules 330 (e.g., dual in-line memory modules (DIMMs)) and multiple rows of memory support modules 332 (e.g., DIMM control modules) to which air-cooled heat sinks are coupled. In the embodiment illustrated, memory modules 330 and the memory support modules 332 are partially arrayed near front 331 of electronic system 313, and partially arrayed near back 333 of electronic system 313. Also, in the embodiment of FIG. 3, memory modules 330 and the memory support modules 332 are cooled by air flow 315 across the electronic system.

The illustrated liquid-based cooling system further includes multiple coolant-carrying tubes connected to and in fluid communication with liquid-cooled cold plates 320. The coolant-carrying tubes comprise sets of coolant-carrying tubes, with each set including (for example) a coolant supply tube 340, a bridge tube 341 and a coolant return tube 342. In this example, each set of tubes provides liquid coolant to a series-connected pair of cold plates 320 (coupled to a pair of processor modules). Coolant flows into a first cold plate of each pair via the coolant supply tube 340 and from the first cold plate to a second cold plate of the pair via bridge tube or line 341, which may or may not be thermally conductive. From the second cold plate of the pair, coolant is returned through the respective coolant return tube 342. Note that in an alternate implementation, each liquid-cooled cold plate 320 could be coupled directly to a respective coolant supply tube 340 and coolant return tube 342, that is, without series connecting two or more of the liquid-cooled cold plates.

FIG. 4 depicts in greater detail an alternate electronic system layout comprising eight processor modules, each having a respective liquid-cooled cold plate of a liquid-based cooling system coupled thereto. The liquid-based cooling system is shown to further include associated coolant-carrying tubes for facilitating passage of liquid coolant through the liquid-cooled cold plates and a header subassembly to facilitate distribution of liquid coolant to and return of liquid coolant from the liquid-cooled cold plates. By way of specific example, the liquid coolant passing through the liquid-based cooling subsystem is cooled and conditioned (e.g., filtered) water.

FIG. 4 is an isometric view of one embodiment of an electronic system or drawer, and monolithic cooling system. The depicted planar server assembly includes a multi-layer printed circuit board to which memory DIMM sockets and various electronic components to be cooled are attached both physically and electrically. In the cooling system depicted, a supply header is provided to distribute liquid coolant from a single inlet to multiple parallel coolant flow paths and a return header collects exhausted coolant from the multiple parallel coolant flow paths into a single outlet. Each parallel coolant flow path includes one or more cold plates in series flow arrangement to facilitate cooling one or more electronic components to which the cold plates are mechanically and thermally coupled. The number of parallel paths and the number of series-connected liquid-cooled cold plates depends, for example, on the desired component temperature, available coolant temperature and coolant flow rate, and the total heat load being dissipated from each electronic component.

More particularly, FIG. 4 depicts a partially assembled electronic system 413 and an assembled liquid-based cooling system 415 coupled to primary heat-generating components (e.g., including processor die) to be cooled. In this embodiment, the electronic system is configured for (or as) a node of an electronics rack, and includes, by way of example, a support substrate or planar board 405, a plurality of memory module sockets 410 (with the memory modules (e.g., dual in-line memory modules) not shown), multiple rows of memory support modules 432 (each having coupled thereto an air-cooled heat sink 434), and multiple processor modules (not shown) disposed below the liquid-cooled cold plates 420 of the liquid-based cooling system 415.

In addition to liquid-cooled cold plates 420, liquid-based cooling system 415 includes multiple coolant-carrying tubes, including coolant supply tubes 440 and coolant return tubes 442 in fluid communication with respective liquid-cooled cold plates 420. The coolant-carrying tubes 440, 442 are also connected to a header (or manifold) subassembly 450 which facilitates distribution of liquid coolant to the coolant supply tubes and return of liquid coolant from the coolant return tubes 442. In this embodiment, the air-cooled heat sinks 434 coupled to memory support modules 432 closer to front 431 of electronic system 413 are shorter in height than the air-cooled heat sinks 434' coupled to memory support modules 432 near back 433 of electronic system 413. This size difference is to accommodate the coolant-carrying tubes 440, 442 since, in this embodiment, the header subassembly 450 is at the front 431 of the electronics drawer and the multiple liquid-cooled cold plates 420 are in the middle of the drawer.

Liquid-based cooling system 415 comprises a pre-configured monolithic structure which includes multiple (pre-assembled) liquid-cooled cold plates 420 configured and disposed in spaced relation to engage respective heat-generating electronic components. Each liquid-cooled cold plate 420 includes, in this embodiment, a liquid coolant inlet and a liquid coolant outlet, as well as an attachment subassembly (i.e., a cold plate/load arm assembly). Each attachment subassembly is employed to couple its respective liquid-cooled cold plate 420 to the associated electronic component to form the cold plate and electronic component (or device) assemblies. Alignment openings (i.e., thru-holes) are provided on the sides of the cold plate to receive alignment pins or positioning dowels during the assembly process. Additionally, connectors (or guide pins) are included within attachment subassembly, which facilitate use of the attachment assembly.

As shown in FIG. 4, header subassembly 450 includes two liquid manifolds, i.e., a coolant supply header 452 and a coolant return header 454, which in one embodiment, are coupled together via supporting brackets. In the monolithic cooling structure of FIG. 4, the coolant supply header 452 is metallurgically bonded in fluid communication to each coolant supply tube 440, while the coolant return header 454 is metallurgically bonded in fluid communication to each coolant return tube 452. A single coolant inlet 451 and a single coolant outlet 453 extend from the header subassembly for coupling to the electronics rack's coolant supply and return manifolds (not shown).

FIG. 4 also depicts one embodiment of the pre-configured, coolant-carrying tubes. In addition to coolant supply tubes 440 and coolant return tubes 442, bridge tubes or lines 441 are provided for coupling, for example, a liquid coolant outlet of one liquid-cooled cold plate to the liquid coolant inlet of another liquid-cooled cold plate to connect in series fluid flow the cold plates, with the pair of cold plates receiving and returning liquid coolant via a respective set of coolant supply and return tubes. In one embodiment, the coolant supply tubes 440, bridge tubes 441 and coolant return tubes 442 are each pre-configured, semi-rigid tubes formed of a thermally conductive material, such as copper or aluminum, and the tubes are respectively brazed, soldered or welded in a fluid-tight manner to the header subassembly and/or the liquid-cooled cold plates. The tubes are pre-configured for a particular electronics system to facilitate installation of the monolithic structure in engaging relation with the electronic system.

One issue with liquid-cooled cold plates, or more generally, coolant-cooled heat sinks, is that as the liquid coolant flows through the liquid-cooled structure, for instance, through one or more compartments, channels, fin arrays, tubes, etc., the temperature of the coolant rises due to the coolant absorbing heat from the wetted heat transfer surfaces of the coolant-cooled heat sink. This increase in coolant temperature means that the temperature of the heat transfer surface must increase to transfer the same amount of heat as the coolant flows through the heat sink, which can result in a reduced effective cooling capability in the downstream regions of the coolant-cooled heat sink. The phenomenon can lead to a non-uniform temperature profile at a main heat transfer surface of the coolant-cooled heat sink, such as the base of a liquid-cooled cold plate, which can result in sub-optimal cooling of the electronic component(s) to which the liquid-cooled heat sink is attached. Thus, disclosed hereinbelow are various coolant-cooled heat sink geometries designed to enhance cooling capability in the downstream regions of the coolant-cooled heat sink, and thereby enhance thermal performance of the coolant-cooled heat sink.

In one aspect, disclosed below is a cooling apparatus which includes a coolant-cooled heat sink having a thermally conductive structure with a coolant-carrying compartment comprising, at least in part, a varying transverse cross-sectional coolant flow area through which coolant flows in a direction substantially parallel to a main heat transfer surface of the thermally conductive structure, for instance, to a main heat transfer surface to which one or more electronic components to be cooled are coupled, and across which heat is transferred from the electronic component(s) to the heat sink. The coolant-cooled heat sink further includes a coolant inlet and a coolant outlet associated with the thermally conductive structure, which are in fluid communication with the coolant-carrying compartment to facilitate coolant flow through the coolant-carrying compartment of the thermally conductive structure. The cross-sectional coolant flow area of the coolant-carrying compartment is designed to decrease (or partially converge), at least in part, between the coolant inlet and the coolant outlet in a direction of coolant flow through the coolant-carrying compartment. This decreasing coolant flow area facilitates increasing the effective heat transfer coefficient between the main heat transfer surface of the coolant-cooled heat sink and the coolant within the coolant-carrying compartment in the direction of coolant flow by, at least in part, accelerating the coolant flow within the coolant-carrying compartment of the coolant-cooled heat sink.

In one embodiment, the thermally conductive structure is further configured with an increasing wetted surface area within the coolant-carrying compartment in the direction of coolant flow; that is, is configured with an increasing surface area exposed to the coolant flow on which the increasing effective heat transfer coefficient may act.

In one implementation, the thermally conductive structure further includes multiple coolant flow regions serially coupled in fluid communication within the coolant flow compartment, wherein the cross-sectional coolant flow area varies between coolant flow regions of the multiple coolant flow regions of the coolant-carrying compartment of the thermally conductive structure. By way of example, the multiple coolant flow regions may comprise multiple thermally conductive fin regions, wherein one or more fin region characteristics or attributes may vary between different thermally conductive fin regions of the multiple thermally conductive fin regions.

For example, in one embodiment, a size of thermally conductive fins may increase from one thermally conductive fin region to another thermally conductive fin region of the multiple thermally conductive fin regions, which facilitates providing a reduced cross-sectional coolant flow area in the another thermally conductive fin region compared with the one thermally conductive fin region, wherein the one thermally conductive fin region is upstream of the another thermally conductive fin region in the direction of coolant flow through the coolant-carrying compartment.

In another example, a number of thermally conductive fins may increase from one thermally conductive fin region to another thermally conductive fin region of the multiple thermally conductive fin regions, which facilitates providing a reduced cross-sectional coolant flow area in the another thermally conductive fin region compared with the one thermally conductive fin region, wherein the one thermally conductive fin region is upstream of the another thermally conductive fin region in the direction of coolant flow through the coolant-carrying compartment.

As a specific example, a size of thermally conductive fins may increase from a first thermally conductive fin region to a second thermally conductive fin region of the multiple thermally conductive fin regions, which facilitates reducing the cross-sectional coolant flow area in the second thermally conductive fin region compared with the first thermally conductive fin region, and a number of thermally conductive fin regions may increase from the second thermally conductive fin region to a third thermally conductive fin region of the multiple thermally conductive fin regions, which further reduces the cross-sectional coolant flow area in the third thermally conductive fin region compared with the second thermally conductive fin region. In this example, the first thermally conductive fin region is upstream of the second thermally conductive fin region, and the second thermally conductive fin region is upstream of the third thermally conductive fin region in the direction of coolant flow through the coolant-carrying compartment of the thermally conductive structure.

In one implementation, the coolant-cooled heat sink includes a coolant inlet manifold region and a coolant outlet manifold region within the coolant-carrying compartment, the coolant inlet manifold region receiving coolant from the coolant inlet, and the coolant outlet manifold region exhausting coolant from the coolant outlet, wherein the multiple coolant flow regions are disposed between the coolant inlet manifold region and the coolant outlet manifold region.

In another embodiment, the multiple coolant flow regions may comprise multiple thermally conductive pin fin regions, and wherein one thermally conductive pin fin region of the multiple thermally conductive pin fin regions may comprise pin fins of different sizes, with smaller pin fins being interspersed among larger pin fins. Further, in an implementation where the thermally conductive fins comprise pin fins, density of the thermally conductive pin fins may increase from one thermally conductive fin region to another thermally conductive fin region, which facilitates providing a reduced transverse coolant flow area in the another thermally conductive fin region compared to the one thermally conductive fin region, wherein the one thermally conductive fin region is upstream of the another thermally conductive fin region in the direction of coolant flow through the coolant-carrying compartment.

In still another implementation, multiple coolant flow channels may be disposed within the coolant flow compartment of the thermally conductive structure. These multiple coolant flow channels may be configured to provide the decreasing cross-sectional coolant flow area. For instance, at least one of a height or a width of one or more of the coolant flow channels of the multiple coolant flow channels may decrease in the direction of coolant flow through the coolant-carrying compartment. In one specific example, both the height and the width of the coolant flow channels may decrease in the direction of coolant flow through the coolant-carrying compartment.

To restate, disclosed herein are various cooling apparatuses which comprise a coolant-cooled heat sink configured to couple to, for instance, one or more electronic components, such as an electronics module, to be cooled. The heat sink includes an inlet, an outlet, and a coolant-carrying compartment configured to allow coolant flow to traverse the compartment in a direction, at least partially, parallel to a main heat transfer surface of the heat sink to be coupled to the electronic component to be cooled. The cross-sectional coolant flow area within the coolant-carrying compartment of the heat sink is configured to decrease, at least partially, in the direction of coolant flow through the compartment so that the cross-sectional coolant flow area of the compartment transverse to the direction of coolant flow is larger closer to the inlet than the outlet. Within this structure, the coolant flow accelerates, and in various embodiments, interacts with more wetted heat transfer surfaces within the compartment as the coolant traverses the coolant-carrying compartment of the heat sink. The heat sink is thus configured to result in the coolant more uniformly absorbing thermal energy from the heat sink structure, notwithstanding a rise in temperature of the coolant as it passes through the compartment. Increasing or accelerating the coolant flow rate within the coolant flow compartment advantageously increases the effective heat transfer coefficient between the main heat transfer surface of the heat sink and the coolant flow, resulting in a more uniform temperature profile across the heat transfer surface of the heat sink in the direction of coolant flow, and thus across the electronic component to be cooled since the temperature difference between the surface and fluid equals the heat rate over the product of the heat transfer coefficient and the wetted surface area.

Figure 5A:
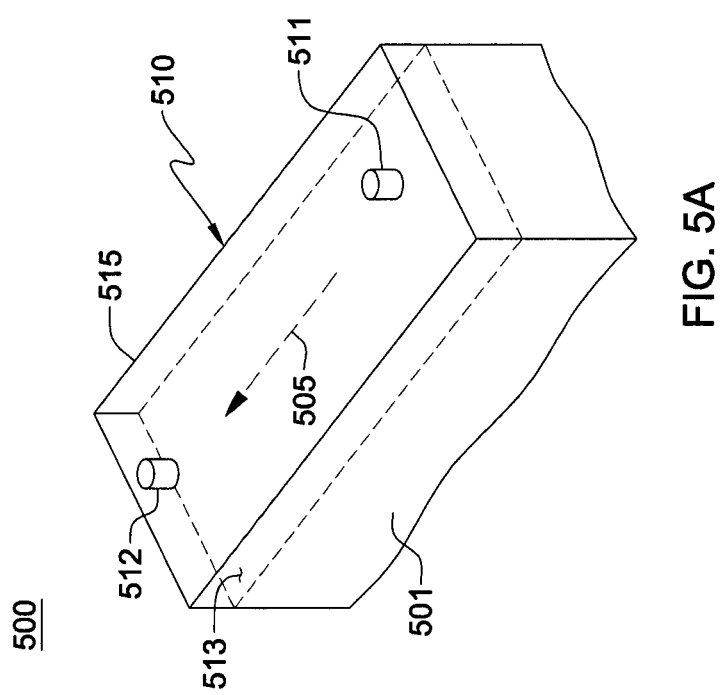
FIG. 5A depicts one embodiment of a cooled electronic module comprising at least one electronic component and a cooling apparatus comprising a coolant-cooled heat sink, in accordance with one or more aspects of the present invention.
Figure 5B:
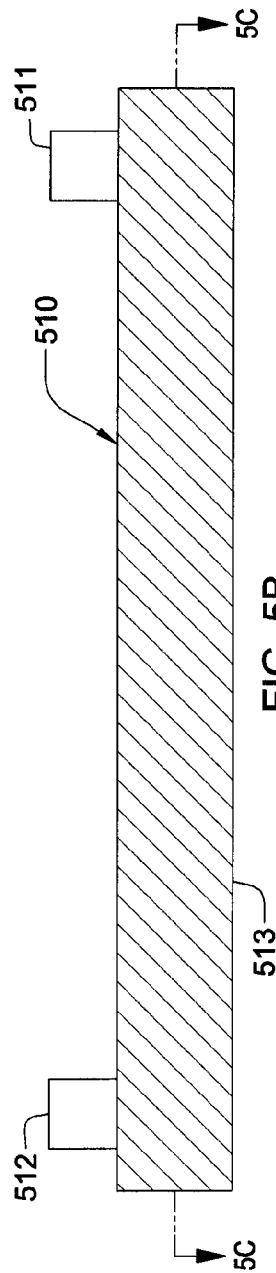
FIG. 5B is an elevational view of the coolant-cooled heat sink of FIG. 5A, taken along line 5B-5B in the cross-sectional plan view of FIG. 5C, in accordance with one or more aspects of the present invention.
Figure 5C:
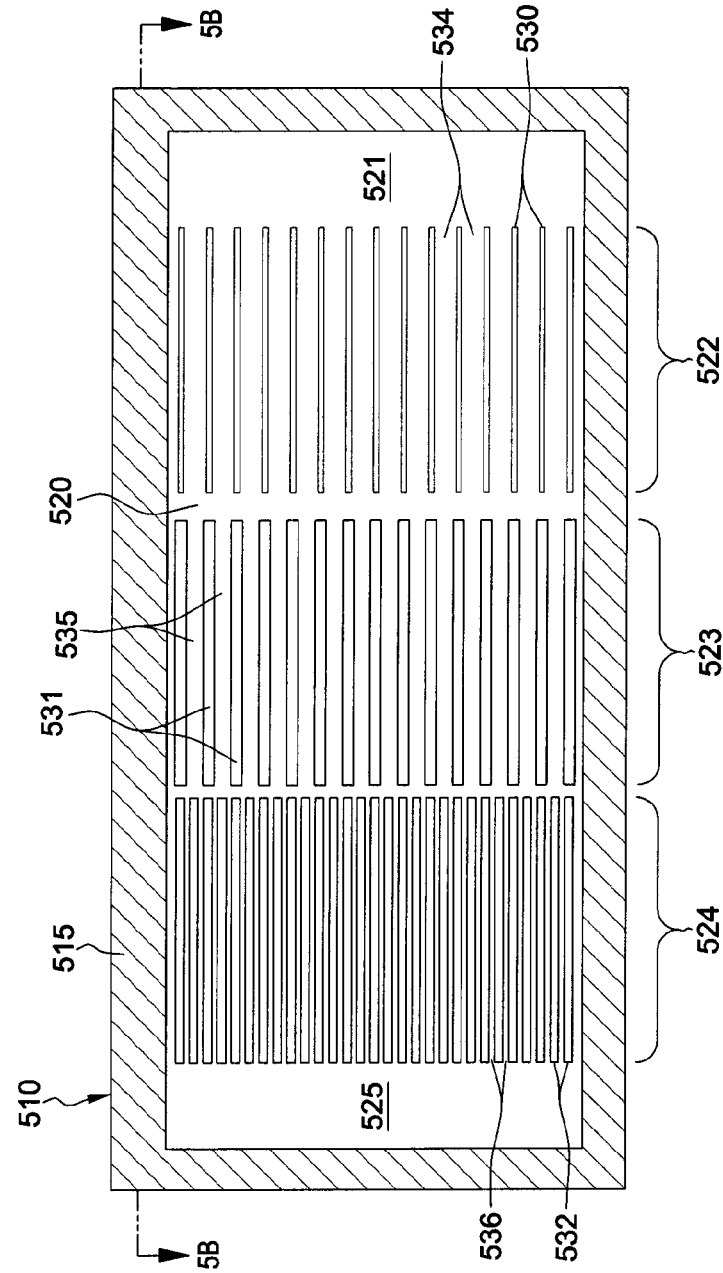
FIG. 5C is a cross-sectional plan view of the coolant-cooled heat sink of FIGS. 5A & 5B, taken along line 5C-5C in the elevational view of FIG. 5B, in accordance with one or more aspects of the present invention.

FIGS. 5A-5C depict one embodiment of a cooled electronic module, generally denoted 500, in accordance with one or more aspects of the present invention. Referring collectively to FIGS. 5A-5C, cooled electronic module 500 includes one or more electronic components 501 to be cooled and a coolant-cooled heat sink 510 coupled to the electronic component(s) 501 to facilitate transfer of heat from the component to, for instance, a liquid coolant passing through coolant-cooled heat sink 510. In one example, the liquid coolant may comprises a system coolant distributed such as described above in connection with FIGS. 2-4.

Coolant-cooled heat sink 510 includes a thermally conductive structure 515, such as a thermally conductive casing or housing, fabricated (for instance) of a metal, which includes a coolant-carrying compartment 520 (e.g., chamber, channel, tube, passageway, etc.) through which coolant flows in a direction 505 through the compartment from a coolant inlet 511 to a coolant outlet 512 of coolant-cooled heat sink 510. In this example, thermally conductive structure 515 includes a main heat transfer surface 513 coupled to and in thermal communication with the electronic component(s) 501 to facilitate heat transfer from the component(s) to the heat sink, and hence, to the coolant flowing through the heat sink. As one example, main heat transfer surface 513 may comprise the base surface of a liquid-cooled cold plate configured as disclosed herein.

As illustrated in the cross-sectional plan view of FIG. 5C, coolant-cooled heat sink 510 includes within coolant-carrying compartment 520, a coolant inlet manifold region 521 and a coolant outlet manifold region 525 disposed adjacent to coolant inlet 511 and coolant outlet 512 (see FIG. 5B), respectively. Coolant inlet manifold region 521 receives coolant from the coolant inlet, and coolant outlet manifold region 525 exhausts coolant from the coolant-carrying compartment 520 through the coolant outlet. Disposed between the coolant inlet and outlet manifold regions 521, 525 are one or more coolant flow regions 522, 523, 524 in series-fluid communication. In this example, three coolant flow regions 522, 523, 524 are depicted by way of example only. As disclosed herein, the cross-sectional coolant flow area is advantageously configured to vary between the different coolant flow regions of the multiple coolant flow regions 522, 523, 524 of the coolant-carrying compartment 520 to facilitate or provide, for instance, an accelerating coolant flow within the coolant-carrying compartment of the coolant-cooled heat sink in the direction 505 of coolant flow through the coolant-carrying compartment. This accelerating coolant flow rate in turn provides an increasing effective heat transfer coefficient between the main heat transfer surface 513 of coolant-cooled heat sink 510 and the coolant flowing therethrough, notwithstanding an increase in temperature of the coolant as the coolant flows through the compartment. Additionally, in certain coolant-cooled heat sink embodiments disclosed herein, the thermally conductive structure 515 is configured with an increasing wetted surface area within the coolant-carrying compartment 520 in the direction 505 of coolant flow through the compartment, that is, an increasing thermally conductive surface area within the compartment exposed to the coolant flow on which the increasing effective heat transfer coefficient may act. Taken together, the heat sink may thus be configured with a substantially uniform effective heat transfer coefficient across, for instance, the main heat transfer surface of the heat sink, and hence, across the electronic components coupled thereto.

As one example, the multiple coolant flow regions may comprise multiple thermally conductive fin regions, wherein the first thermally conductive fin region (for instance, flow region 522) may include a plurality of thermally conductive fins 530 spaced in parallel, opposing relation to define a plurality of coolant flow channels 534 therebetween, and the second thermally conductive fin region (e.g., flow region 523) may comprise a plurality of thermally conductive fins 531, also spaced in parallel, opposing relation to define a plurality of coolant flow channels 535 therebetween. As illustrated in FIG. 5C, in this configuration, thermally conductive fins 531 are sized larger (e.g., wider) than thermally conductive fins 530, which results in reduced space for coolant flow channels 535 defined between thermally conductive fins 531 (and thereby, a reduced cross-sectional coolant flow area) compared with that of thermally conductive fins 530. Note that this example and comparison assumes that there are an equal number of fins within the first and second coolant flow regions 522, 523. As one example, the fins of the coolant-cooled heat sink of FIGS. 5A-5C may comprise rectangular-shaped or plate-type fins extending between, for instance, a base inner surface and an upper inner surface of the thermally conductive structure.

In the example of FIG. 5C, the third thermally conductive fin region (e.g., flow region 524) is disposed downstream of the second thermally conductive fin region (i.e., flow region 523) in the direction of coolant flow 505 through the coolant-carrying compartment 520, and includes a larger number of thermally conductive fins 532 and channels 536 therebetween than the number of thermally conductive fins 531 in the second thermally conductive fin region, or the number of thermally conductive fins 530 in the first thermally conductive fin region. For instance, twice the number of thermally conductive fins 532 may be provided within the third thermally conductive fin region in order to, for instance, further reduce the cross-sectional coolant flow area within the coolant-carrying compartment, thereby providing a structure with multiple flow regions that will accelerate coolant flow through the compartment closer to the coolant outlet manifold region 525, resulting in an increasing effective heat transfer coefficient between, for instance, the main heat transfer surface 513 of the coolant-cooled heat sink 510 and the coolant within the coolant-carrying compartment in the direction of coolant flow through the compartment.

Note that the particular configuration of multiple coolant flow regions 522, 523, 524 of FIG. 5C is presented by way of example only. Numerous variations thereof will be apparent to one of ordinary skill in the art based on the teachings provided herein. For instance, the size of the thermally conductive fins 532 in the third thermally conductive fin region could alternatively increase in size further from that of the thermally conductive fins 531 in the second thermally conductive fin region, without changing the number of fins in the third region. In another example, the number of thermally conductive fins 531 in the second thermally conductive fin region could increase from the number of thermally conductive fins 530 in the first region of thermally conductive fins. In each implementation, however, a goal is to tailor the heat sink so that the transverse cross-sectional coolant flow area through which the coolant flows decreases, for instance, in a direction substantially parallel to a main heat transfer surface of the thermally conductive structure from inlet to outlet thereof. As disclosed herein, the heat sink is configured such that the cross-sectional coolant flow area, at least in part, decreases or partially converges in a direction of coolant flow through the coolant-carrying compartment of the heat sink. Note also that the number and different plate fin regions (or groupings) of FIGS. 5A-5C are presented by way of example only. In other embodiments, the compartment, flow regions and/or fins could comprise any desired shape configured to facilitate a desired cooling profile.

Figure 5D:
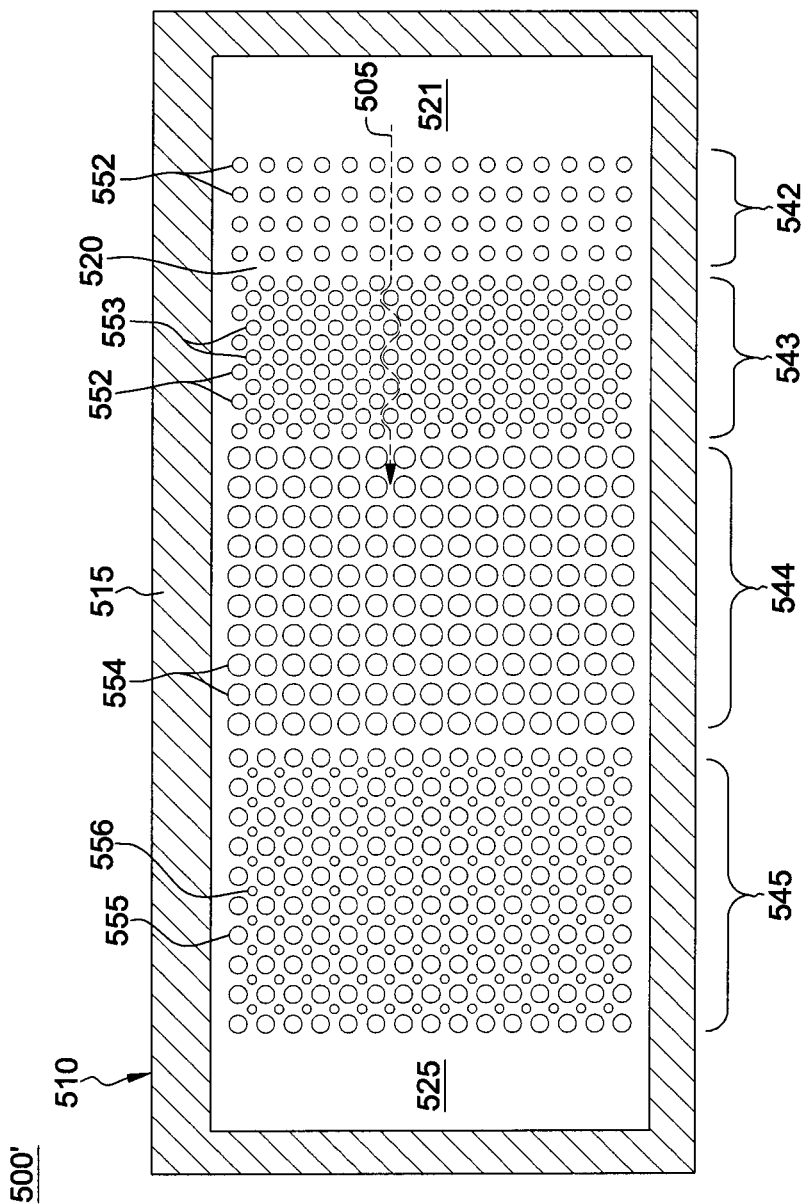
FIG. 5D is a cross-sectional plan view of an alternate embodiment of the coolant-cooled heat sink of FIGS. 5A-5C, in accordance with one or more aspects of the present invention.

FIG. 5D depicts an alternate embodiment of a coolant-cooled heat sink 500', in accordance with one or more aspects of the present invention. This coolant-cooled heat sink 500' is substantially identical to coolant-cooled heat sink 500 described above in connection with FIGS. 5A-5C, with the exception that the multiple coolant flow regions are modified. In the embodiment of FIG. 5D, the multiple coolant flow regions comprise multiple thermally conductive pin fin regions 542, 543, 544, 545, with four regions being shown by way of example only. As in the heat sink embodiment of FIG. 5C, in the example of FIG. 5D, the largest cross-sectional coolant flow area within the pin fin regions is provided closest to the coolant inlet manifold region 521, and the smallest cross-sectional coolant flow area is provided closest to the coolant outlet manifold region 525.

Note that in this example, each thermally conductive pin fin region 542, 543, 544, 545, has a different geometry yielding successively less cross-sectional coolant flow area for liquid coolant to flow within the coolant-carrying compartment 520, and thus an accelerating coolant flow rate as the coolant passes through the compartment. In the first thermally conductive pin fin region 542, a plurality of pin fins 552 are provided arranged in a square or rectangular array, while in the second thermally conductive pin fin region 543, the thermally conductive pin fins 552 are arranged in the same square or rectangular array as in the first thermally conductive pin fin region 542, but there are also pin fins 553 at the centers of each square or rectangle in the array. In the third thermally conductive pin fin region 544, the thermally conductive pin fins 554 are arranged in the same square or rectangular pitch as in the first thermally conductive pin fin region 542 but, in this example, the diameters of the thermally conductive pin fins 554 are significantly larger than the diameters of the thermally conductive pin fins 552 in the first and second thermally conductive pin fin regions 542, 543. In the fourth thermally conductive pin fin region 545, pin fins 555, 556 are provided of different diameters, with the smaller diameter pin fins 556 being interspersed among the larger diameter pin fins 555, each in a square or rectangular array, by way of example.

As liquid coolant flows from coolant inlet manifold region 521 to coolant outlet manifold region 525, the coolant encounters a decreasing or partially converging cross-sectional coolant flow area within the different regions of the compartment. This decreasing coolant flow area in the direction of coolant flow through the coolant-carrying compartment results in an increasing effective heat transfer coefficient between, for instance, a main heat transfer surface of the thermally conductive structure 515 and the coolant by, at least in part, accelerating the coolant flow within the coolant-carrying compartment. Additionally, in the embodiments of FIGS. 5C & 5D, the thermally conductive structure comprises thermally conductive fin regions which have increasing wetted surface areas within the coolant-carrying compartment in the direction of coolant flow through the compartment. Such increasing wetted surface area exposed to the coolant flow on which the increasing effective heat transfer coefficient acts further facilitates heat transfer closer to the coolant outlet manifold region, which allows for a more uniform heat transfer profile across the heat sink, and thus across the electronic compartment to be cooled.

FIGS. 6A-6B depict another embodiment of a cooling apparatus, generally denoted 600, comprising a coolant-cooled heat sink 610, in accordance with one or more aspects of the present invention. As illustrated, coolant-cooled heat sink 610 includes a thermally conductive structure 615, such as a thermally conductive casing or housing, which defines a coolant-carrying compartment (or chamber, passageway, etc.) 620 through which coolant flows from a coolant inlet 611 to a coolant outlet 612. The coolant-carrying compartment 620 includes a varying cross-sectional coolant flow area transverse to, at least in part, a direction 605 of coolant flow substantially parallel to a main heat transfer surface 613 of the thermally conductive structure 615. In one example, the coolant-cooled heat sink 610 is configured as a liquid-cooled cold plate, and the main heat transfer surface 613 is a base surface of the liquid-cooled cold plate. In the embodiment of FIGS. 6A & 6B, a plurality of thermally conductive fins 630 are provided, defining a plurality of coolant flow channels 635. By way of example, the plurality of thermally conductive fins 630 may each have a decreasing height and a decreasing width in the direction 605 of coolant flow through coolant-carrying compartment 620 from a coolant inlet manifold region 621 to a coolant outlet manifold region 622 thereof.

By way of specific example, the thermally conductive fins 630 may comprise in cross-section, trapezoidal-shaped fins of varying height and width. A baffle 640 may be provided over the plurality of thermally conductive fins 630 to ensure that coolant flow within compartment 620 is through the coolant-carrying channels 635 defined between the thermally conductive fins 630. In one embodiment, baffle section 640 may be affixed to or integrated with an upper plate 617 of the coolant-carrying heat sink 610. Note that the trapezoidal-shaped (in plan view) thermally conductive fins 630 have wider fin widths or thicknesses downstream in the direction of coolant flow through the compartment, closer to the coolant outlet manifold region 622, and thus the area for liquid flow through channels 635 is reduced along the coolant-carrying channels. In addition to this width reduction, the thermally conductive fins may also be sloped, with a reducing height in the direction of coolant flow, thus leading to even greater reduction in transverse cross-sectional flow area through the channels. Together, these configurational changes result in a tapering or decreasing coolant flow area within the coolant-carrying compartment in the region of the plurality of thermally conductive fins.

Those skilled in the art should note that a variety of manufacturing techniques may be employed in constructing the coolant-cooled heat sinks of the cooling apparatuses disclosed herein. For instance, a higher fin density region of an accelerating coolant flow heat sink may be fabricated by providing different arrays of fins associated with an upper plate and lower plate of the heat sink, and then joining the plates together such that the fins intersperse or interleave. In one example, this manufacturing approach could be readily employed to create a fin region with twice the fin density as another fin region by providing a similar fin pattern in the second fin region associated with the upper plate as the bottom plate, but not in the first fin region. Different fin arrays associated with the upper plate and lower plate may be provided in different regions of the coolant-cooled heat sink to create any desired geometry. In one implementation, thermally conductive joints are also established so that, for instance, thermally conductive fins extending downwards from the upper plate may perform nearly as well as the thermally conductive fins extending upwards from the base plate. Solder, brazing or welding techniques may be employed to ensure the presence of good thermally conductive joints.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention.

What is claimed is:

1. A method comprising:
providing a coolant-cooled heat sink configured to facilitate cooling at least one electronic component, the providing the coolant-cooled heat sink comprising:
providing a thermally conductive structure with a coolant-carrying compartment comprising, at least in part, a plurality of thermally conductive fins defining there between a plurality of coolant flow channels through which coolant flows in a direction substantially parallel to a main heat transfer surface of the thermally conductive structure, the plurality of thermally conductive fins decreasing in height and increasing in width in the direction of coolant flow, and the plurality of coolant flow channels each having a cross-sectional coolant flow area which decreases in height and decreases in width in the direction of coolant flow through the coolant-carrying compartment;
a baffle within the coolant-carrying compartment disposed over, and in contact with, the plurality of thermally conductive fins, throughout the plurality of thermally conductive fins in the direction of coolant flow, the baffle increasing in height in the direction of coolant flow in proportion to the decreasing in height of the plurality of thermally conductive fins in the direction of coolant flow, and the baffle ensuring that all coolant flow through the coolant-carrying compartment flows between the plurality of thermally conductive fins, within the plurality of coolant flow channels of decreasing cross-sectional flow area;
providing a coolant inlet manifold region and a coolant outlet manifold region within the coolant-carrying compartment of the thermally conductive structure to facilitate coolant flow through the plurality of coolant flow channels, the plurality of thermally conductive fins extending between the coolant inlet manifold region and the coolant outlet manifold region; and
wherein the decreasing height and width of the respective cross-sectional coolant flow area of each coolant flow channel of the plurality of coolant flow channels facilitates an increasing effective heat transfer coefficient between the main heat transfer surface and the coolant within the plurality of coolant flow channels in the direction of coolant flow by, at least in part, accelerating the coolant flow within the plurality of coolant flow channels of the coolant-cooled heat sink.

2. The method of claim 1, wherein the baffle disposed within the coolant-carrying compartment rests on top of the plurality of thermally conductive fins and is a distinct structure from the thermally conductive structure having the coolant-carrying compartment.

3. The method of claim 2, wherein each thermally conductive fin of the plurality of thermally conductive fins is trapezoidal-shaped in cross-section.

4. The method of claim 1, wherein the baffle defines, in part, the coolant outlet manifold region within the coolant-carrying compartment of the thermally conductive structure, and is spaced from the coolant inlet manifold region within the coolant-carrying compartment by the plurality of thermally conductive fins, and does not define, in part, the coolant inlet manifold region within the coolant-carrying compartment.

* * * * *